United States Patent [19]

Jett, Jr. et al.

[11] Patent Number: 4,520,324
[45] Date of Patent: May 28, 1985

[54] MOS GAIN CONTROLLED AMPLIFIER

[75] Inventors: William B. Jett, Jr., San Jose; Milton E. Wilcox, Saratoga, both of Calif.

[73] Assignee: National Semiconductor Corporation, Santa Clara, Calif.

[21] Appl. No.: 474,628

[22] Filed: Mar. 11, 1983

[51] Int. Cl.³ .......................... H03F 3/16; H03G 3/10
[52] U.S. Cl. .................................... 330/285; 330/277; 330/253; 330/254; 330/311
[58] Field of Search ............... 330/253, 277, 278, 284, 330/285, 311, 254

[56] References Cited

FOREIGN PATENT DOCUMENTS 1927587 12/1970 Fed. Rep. of Germany ...... 330/283

Primary Examiner—James B. Mullins
Assistant Examiner—Steven J. Mottola
Attorney, Agent, or Firm—Gail W. Woodward; Paul J. Winters; Michael J. Pollock

[57] ABSTRACT

A circuit is disclosed for operating an MOS transistor in its resistive mode. A cascode transistor is used to clamp the voltage across the resistive transistor to the required level. The circuit gain can be controlled by controlling voltage across the resistive transistor.

6 Claims, 4 Drawing Figures

U.S. Patent  May 28, 1985  4,520,324
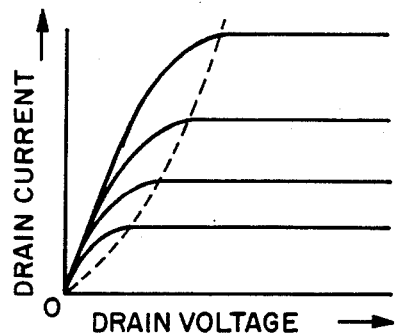
Fig_1
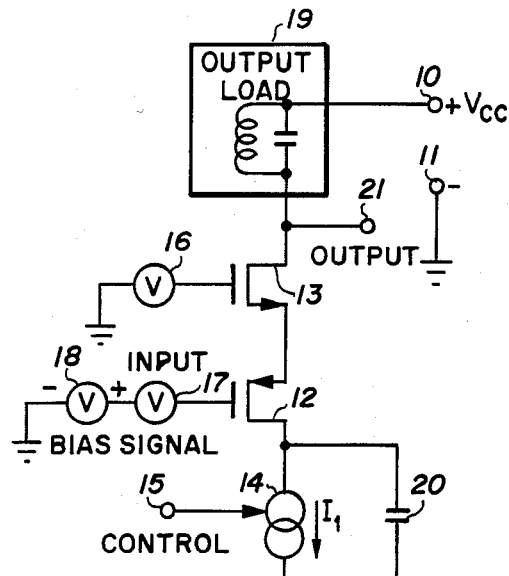
Fig_2
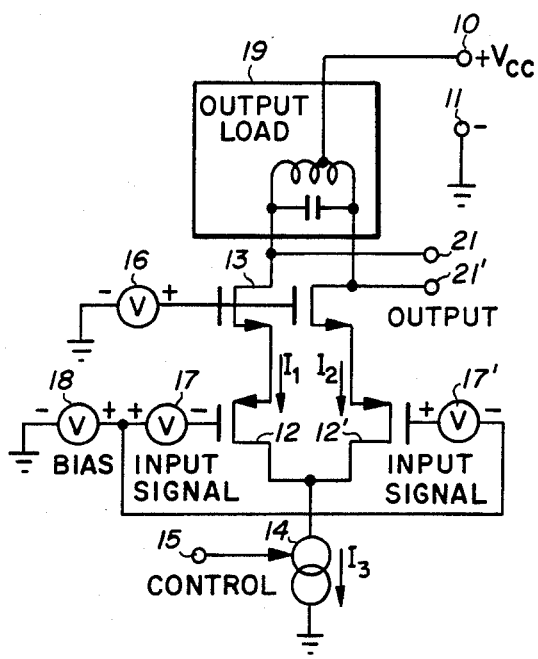
Fig_3
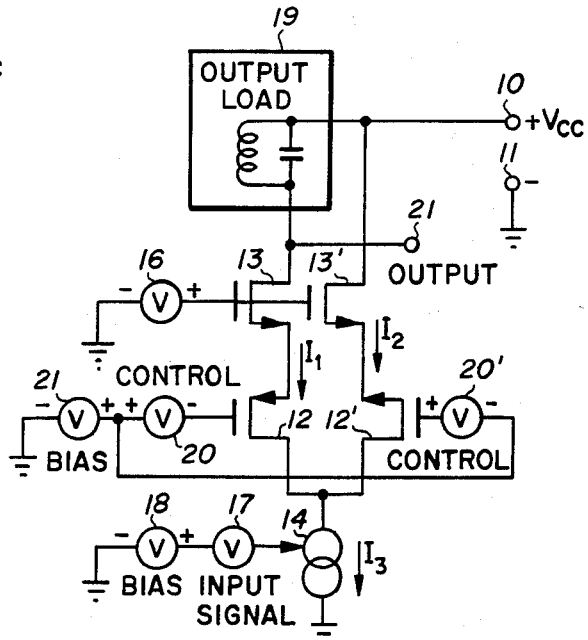
Fig_4

MOS GAIN CONTROLLED AMPLIFIER

BACKGROUND OF THE INVENTION

Metal oxide semiconductor (MOS) devices are being extensively incorporated into linear integrated circuit (IC) devices. While such devices have been common in digital structures, their performance is such that bipolar transistors have dominated in linear applications. However, where it is desired to combine linear and digital functions on the same IC chip it would be extremely useful to fabricate the linear circuits in MOS form. In particular the use of complementary metal oxide semiconductors (CMOS) structures would be desirable. One of the linear circuit functions that has been difficult to implement in MOS is voltage-controlled variable gain amplifiers.

SUMMARY OF THE INVENTION

It is an object of the invention to provide an MOS amplifier which will vary its gain in response to a control potential.

It is a further object of the invention to operate an MOS transistor in the resistive region where its gain is a function of its drain voltage and current.

It is a still further object of the invention to bias a source follower transistor with a series connected complementary transistor so that the source follower is in the resistive mode where its gain is related to its drain voltage and current.

These and other objects are achieved by connecting a first transistor in series with a second complementary transistor so that the second transistor conducts the same current as the first which therefore is connected as a source follower. The second transistor is biased so that the first transistor can be operated in its resistive mode. The drain of the first transistor is returned to a voltage variable current source which will act to control its voltage and therefore its gain. Since the first transistor is connected as a source follower, the output of which is clamped by the source of the second transistor, its source to drain voltage can be kept below the resistive-to-saturated transition. In this mode the gain is a strong function of the source to drain voltage, which can be varied by a voltage controlled constant current device. Therefore a voltage controlled variable gain is available. In an alternative embodiment a pain of resistive devices is driven in paraphase from a signal source and a pair of complementary transistors are series connected with their sources acting to control the resistive device biasing. A paraphase output is available at the series connected device drains. In another embodiment the signal input is applied by way of the drain current control to a pair of resistive transistors and a load is connected to one side of the pair. The gain control signal is applied in paraphase to the resistive transistor gates. Since the transistors are in the resistive mode, this form of drive is feasible with the series connected devices in combination with the resistive device providing the required circuit gain. This form of control provides a wide range of gain control.

BRIEF DESCRIPTION OF THE DRAWING

FIG. 1 is a graph showing a family of curves that would be associated with an N channel MOS transistor.

FIG. 2 is a schematic diagram of the basic circuit of the invention.

FIG. 3 is a schematic diagram of a differential version of the FIG. 2 embodiment.

FIG. 4 is a schematic diagram of another alternative embodiment.

DESCRIPTION OF THE INVENTION

FIG. 1 shows a well-known family of MOS transistor curves, plotting drain voltage against drain current for various gate voltages. While the illustration indicates an N channel MOS transistor, a P channel device would be the same except for inverted polarities. The dashed line represents the drain saturation or $D_{SAT}$ values. To the right of the dashed line the transistor is saturated and to the left the transistor is in its so called "resistive" mode. In the resistive mode it can be seen that for all gate voltages the lines converge upon zero. Therefore, in the resistive mode the device gain is a function of the drain voltage.

The circuit of FIG. 2 takes advantage of the resistive mode to create a variable gain amplifier circuit. A series array of transistors is coupled across a $V_{CC}$ power supply which is connected + to terminal 10 and − to ground terminal 11. In this circuit transistor 12 will be operated in its resistive mode while transistor 13 will be operated in the saturated mode. Current sink 14 could be accomplished by an N channel MOS transistor operated in the saturated mode or an NPN bipolar transistor. The circuit is operated so that the combined voltage drops across transistors 13 and sink 14 reduce the voltage across transistor 12 to that level at which it will be in its resistive mode. A current, shown as $I_1$, will flow in the series transistors and its magnitude will be set by the potential at control terminal 15.

Transistor 13 is connected as a series connected amplifier with its source driven from the source of transistor 12 which is connected as a source follower that responds to a signal 17 impressed upon its gate. Since the gate of transistor 13 is returned to a voltage source 16, its source will act to clamp the potential at the source of transistor 12 at a relatively low impedance level to close to one threshold below the value of voltage source 16. Bias voltage source 18 is selected to operate the d-c bias on transistor 12 to keep it in its resistive mode. Signal input source 17 will drive or modulate the current in transistor 12 which will act as a variable resistor in series with the source of series connected transistor 13. Output load 9 can simply be an antiresonant circuit, as shown, tuned to the frequency of signal source 17. Thus, while transistor 12 is connected as a source follower it operates at below unity voltage gain to drive the source of transistor 13. The transconductance, or $G_M$, of a resistive mode transistor is:

$$G_M = \mu C_{OX} W/L\, V_{DS}$$

where $\mu$ is the transistor carrier mobility, $C_{OX}$ is the gate oxide capacitance, W/L is the transistor channel width to length ratio, and $V_{DS}$ is the drain-to-source voltage.

Since $\mu$ is a material characteristic and the gate oxide thickness is set by other considerations, it can be seen that transconductance is determined by the transistor geometry and the applied voltage. In FIG. 2, since transistor 13 clamps the source potential on transistor 12, the gain will be determined by the potential at the drain of transistor 12. This potential will be determined by the operating curves of transistor 12, the gate bias of which is set by bias source 18. This bias is chosen so that transistor 12 is operated at a gate to source bias that ensure its operation below $D_{SAT}$.

As the potential at terminal 15 is raised so as to increase $I_1$ it can be seen that the potential across sink 14 will ordinarily fall thereby increasing the potential across transistor 12 (because its source is clamped). From the above formula it is clear that increasing the voltage across a resistive mode operated transistor will increase its signal output.

If the potential at terminal 15 is lowered, $I_1$ will decrease. At the same time the voltage drop across sink 14 will increase and transistor 12 will have a lower applied voltage. This will result in reduced signal output.

The above shows that as long as transistor 12 is operated in its resistive region it will serve as a voltage controlled variable output device. It is well suited for signal gain control applications. Capacitor 20 provides a signal ground at the drain of transistor 12 so that the drain voltage does not change from an a-c signal standpoint.

It is to be understood that the transistor conductivity types shown in FIG. 2 can be complemented and the power supply polarity reversed.

FIG. 3 is a schematic diagram showing an alternative embodiment of the invention. Here a pair of transistors 12 and 12' are operated in the resistive mode. Their drains are connected together to current sink 14 which passes a current $I_3$ in response to the potential at control terminal 15. Series connected transistors 13 and 13' have their gates returned in common to voltage source 16. Thus the sources of transistors 12 and 12' are clamped close to one transistor threshold below the potential of voltage source 16. The gates of transistors 12 and 12' are driven in paraphase from signal sources 17 and 17'. Output load device 19 represents a pair of antiresonant circuits in series with the drains of transistors 13 and 13' and will be driven in paraphase from the amplified version of the signals from 17 and 17' to produce a paraphase output at terminals 21 and 21'. In this circuit $I_3 = I_1 + I_2$. $I_1$ and $I_2$ operate in phase opposition so that a virtual ground exists at the drains of transistors 12 and 12'. Therefore, no shunt signal bypass capacitor is needed. Each side of the circuit operates in the same manner as the circuit of FIG. 1 and the control potential at terminal 15 will vary the amplifier gain as described above.

FIG. 4 shows another alternative embodiment of the invention. Here signal source 17 applies an input signal to the control terminal of sink 14 along with a d-c bias from source 18. Thus, $I_3$ will have a constant d-c component along with a signal component. Series connected transistors 13 and 13' are returned to a source of bias 16 as was the case in FIG. 3. A paraphase control potential is applied to the gates of transistors 12 and 12' from control sources 20 and 20'. Since $I_3$ has a constant d-c component which equals $I_1 + I_2$ the control input will vary $I_1$ relative to $I_2$. When $I_1 = I_3$ the circuit operates at maximum gain. When $I_2 = I_3$ it can be seen that $I_1$ and the signal in load 19 will be zero. Thus, the signal output at terminal 21 will actually be attenuated. The circuit of FIG. 4 is similar to that of FIG. 2 with the signal and control inputs switched along with a modulated shunt current path around transistor 12.

The invention has been described and alternative circuits detailed. Other alternatives and equivalents, within the spirit and intent of the invention, will become apparent to a person skilled in the art upon reading the foregoing description. Accordingly, it is intended that the scope of the invention be limited only by the following claims.

We claim:

1. An MOS transistor variable gain amplifier circuit comprising:
   a first MOS transistor having source, drain and gate electrodes;
   supply rails connectable to a source of operating power for providing source and sink rails for the current carriers in said circuit;
   a second MOS transistor complementary to said first MOS transistor and having source, drain and gate electrodes;
   means for connecting said source of said second MOS transistor to said source of said first transistor;
   means for connecting said gate of said second transistor to a source of potential which is selected to control the biasing of said source of said first MOS transistor;
   means, responsive to a control potential, for varying the voltage between said source and said drain of said first MOS transistor;
   signal input means coupled to said first MOS transistor to modulate the current therein; and
   load means coupled in series with the source-drain electrodes of said second MOS transistor for developing a signal output; whereby said first MOS transistor is operated in its resistive region below saturation and said circuit displays a gain between said signal input and said signal output that varies as a function of said control potential.

2. The circuit of claim 1 wherein said input signal is applied to said gate of said first MOS transistor, and said second MOS transistor has an antiresonant circuit coupled between its drain and said source rail, and tuned to said signal input frequency, thereby to develop said signal output.

3. The circuit of claim 2 further comprising third and fourth MOS transistors having their source-drain circuits in series; said third MOS transistor having the same conductivity type as said first MOS transistor and said fourth transistor being complementary thereto; said third MOS transistor having a drain coupled to said drain of said first MOS transistor, a source coupled to the source of said fourth transistor, and a gate coupled to a source of signal operating out of phase with respect to the phase of said signal input coupled to said gate of said first transistor; said fourth MOS transistor having its gate coupled to the gate of said second MOS transistor and its drain coupled to said source rail.

4. The circuit of claim 3 wherein said drain of said fourth MOS transistor is coupled to said source rail via said antiresonant circuit.

5. The circuit of claim 1 wherein said means for varying the voltage between said source and said drain of said first transistor comprises a constant current device having a control terminal coupled to said signal input means and said control potential is coupled to said gate of said first transistor.

6. The circuit of claim 5 further comprising fifth and sixth MOS transistors; said fifth MOS transistor being of the same conductivity type as said first and having its source drain circuit coupled in series with the source drain circuit of said sixth transistor which has the same conductivity type as said second MOS transistor; means coupling the drain of said fifth MOS transistor to said drain of said first MOS transistor; means coupling the drain of said sixth transistor to said source rail; means coupling the gate of said sixth MOS transistor to said gate of said second transistor; and means coupling the gate of said fifth MOS transistor to a source of control potential operating in paraphase with said source of control potential coupled to said gate of said first MOS transistor.

* * * * *